(12) United States Patent
Nishihara

(10) Patent No.: US 10,297,540 B2
(45) Date of Patent: May 21, 2019

(54) WIRING SUBSTRATE

(71) Applicant: SHINKO ELECTRIC INDUSTRIES CO., LTD., Nagano-shi, Nagano (JP)

(72) Inventor: Yoichi Nishihara, Nagano (JP)

(73) Assignee: SHINKO ELECTRIC INDUSTRIES, CO., LTD., Nagano-Shi (JP)

( * ) Notice: Subject to any disclaimer, the term of this patent is extended or adjusted under 35 U.S.C. 154(b) by 4 days.

(21) Appl. No.: 15/978,500

(22) Filed: May 14, 2018

(65) Prior Publication Data

US 2018/0337117 A1 Nov. 22, 2018

(30) Foreign Application Priority Data

May 17, 2017 (JP) .................................. 2017-098311

(51) Int. Cl.
| | |
|---|---|
| H05K 1/11 | (2006.01) |
| H01L 23/498 | (2006.01) |
| H01L 23/00 | (2006.01) |
| H01L 21/48 | (2006.01) |
| H01L 21/66 | (2006.01) |

(52) U.S. Cl.
CPC ...... *H01L 23/49822* (2013.01); *H01L 21/486* (2013.01); *H01L 21/4857* (2013.01); *H01L 21/4864* (2013.01); *H01L 22/10* (2013.01); *H01L 23/49838* (2013.01); *H01L 23/49866* (2013.01); *H01L 23/562* (2013.01); *H05K 1/112* (2013.01); *H01L 23/49816* (2013.01); *H01L 24/16* (2013.01); *H01L 24/32* (2013.01); *H01L 24/73* (2013.01); *H01L 2224/16227* (2013.01); *H01L 2224/16238* (2013.01); *H01L 2224/32225* (2013.01); *H01L 2224/73204* (2013.01); *H01L 2924/35121* (2013.01)

(58) Field of Classification Search
CPC ......... H05K 1/112; H05K 1/115; H05K 1/116
See application file for complete search history.

(56) References Cited

U.S. PATENT DOCUMENTS

| | | | |
|---|---|---|---|
| 6,674,017 B1 | 1/2004 | Yamasaki et al. | |
| 7,071,424 B1 * | 7/2006 | Shirai .................... | H05K 3/421 174/263 |

FOREIGN PATENT DOCUMENTS

| | | |
|---|---|---|
| JP | 2000-244127 | 9/2000 |
| JP | 2001-085846 | 3/2001 |

* cited by examiner

*Primary Examiner* — Jeremy C Norris
(74) *Attorney, Agent, or Firm* — Rankin, Hill & Clark LLP

(57) ABSTRACT

A wiring substrate includes a first wiring layer, an insulation layer arranged on the first wiring layer and formed of a photosensitive resin, a via hole formed in the insulation layer and reaching the first wiring layer, and a second wiring layer formed in the via hole and on the insulation layer and connected to the first wiring layer. A surface of the first wiring layer in the via hole is formed as a roughened surface.

9 Claims, 18 Drawing Sheets

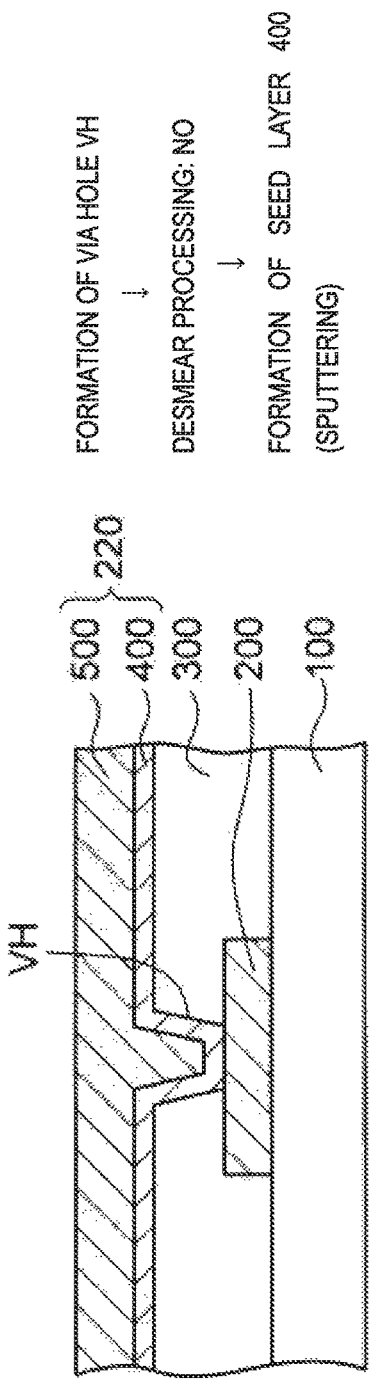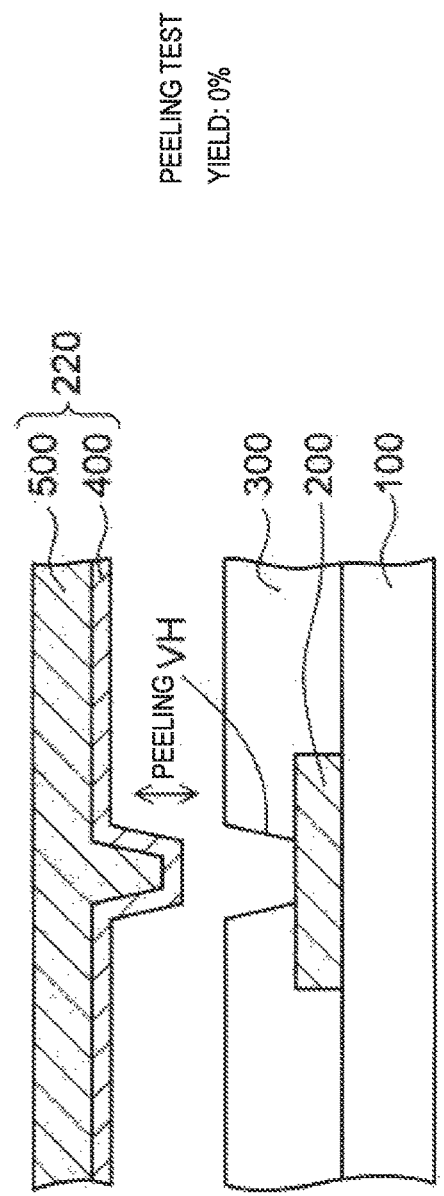

(COMPARATIVE EXAMPLE)

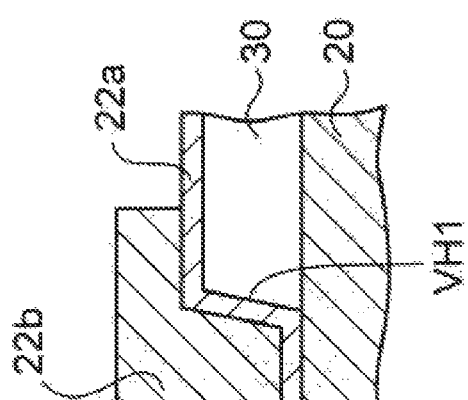
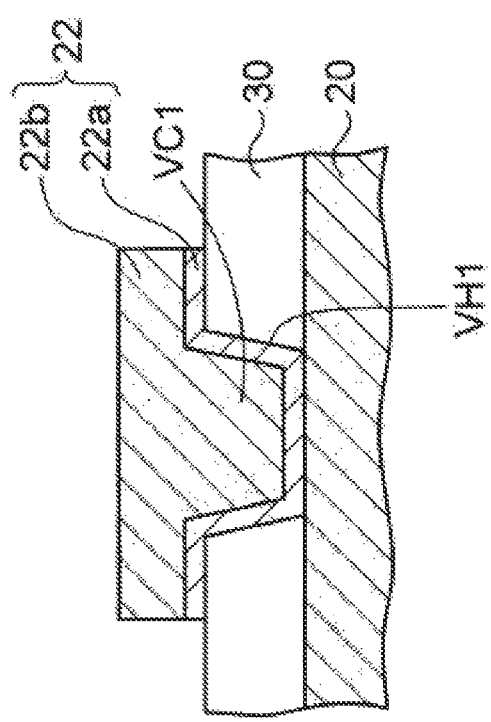
FIG. 13A
FIG. 13B

WIRING SUBSTRATE

CROSS-REFERENCE TO RELATED APPLICATION

The present application claims priority from Japanese Patent Application No. 2017-098311 filed on May 17, 2017, the entire content of which is incorporated herein by reference.

BACKGROUND

Technical Field

The present disclosure relates to a wiring substrate.

Related Art

In the related art, a wiring substrate for mounting thereon electronic components such as semiconductor chips has been known. In recent years, as the electronic components have been made to have high performance, the wiring substrate has been further highly densified and multi-layered.
Patent Document 1: JP-A-2000-244127
Patent Document 2: JP-A-2001-85846

As described later in paragraphs of preliminary matters, in order to obtain a fine multi-layered wiring layer, a method of forming a via hole in a photosensitive resin layer by a photolithography to obtain an insulation layer is adopted. Also, when forming a wiring layer on the insulation layer by a semi-additive method, a seed layer of a thin film is formed by a sputtering method.

In the above method, when resin smear in the via hole is removed by general desmear processing, a surface of the insulation layer formed of a photosensitive resin layer is excessively roughened. Also, when the desmear processing is omitted, it is not possible to obtain the sufficient adhesion strength of via connection.

SUMMARY

Exemplary embodiments of the present disclosure provide a wiring substrate including an insulation layer formed of a photosensitive resin and having a via hole formed therein which can the sufficient adhesion strength of via connection.

A wiring substrate comprises:
a first wiring layer;
an insulation layer arranged on the first wiring layer and formed of a photosensitive resin;
a via hole formed in the insulation layer and reaching the first wiring layer; and
a second wiring layer formed in the via hole and on the insulation layer and connected to the first wiring layer,
wherein a surface of the first wiring layer in the via hole is formed as a roughened surface.

A manufacturing method of a wiring substrate comprises:
forming, a photosensitive resin layer on a first wiring layer;
forming an insulation layer having a via hole reaching the first wiring layer by exposing and developing the photosensitive resin layer;
forming, a surface of the first wiring layer in the via hole, as a roughened surface; and forming a second wiring layer, which is connected to the first wiring layer, on the insulation layer from an inside of the via hole.

According to the present disclosure, the wiring substrate includes the insulation layer of the photosensitive resin formed on the wiring layer. Also, the insulation layer is formed therein with the via hole reaching the first wiring layer. Also, the second wiring layer connected to the first wiring layer is formed on the insulation layer from the inside of the via hole. The surface of the first wiring layer in the via hole is formed as the roughened surface.

In this way, in the wiring substrate including the insulation layer formed of the photosensitive resin, since the surface of the first wiring layer in the via hole is locally formed as the roughened surface, it is possible to obtain the sufficient adhesion strength of the via connection by an anchor effect.

In one favorable aspect, the surface roughness (Ra) of the first wiring layer in the via hole is greater than the surface roughness (Ra) of the insulation layer, and the surface of the insulation layer is formed as a smooth surface.

Also, in one favorable aspect, the second wiring layer is formed by the semi-additive method, and the seed layer of a thin film is formed by the sputtering method.

Thereby, when forming the fine second wiring layer by the semi-additive method, an over-etching amount is reduced upon etching of the seed layer. Accordingly, a decrease in a pattern width, a pattern error and the like are prevented.

BRIEF DESCRIPTION OF THE DRAWINGS

FIGS. 2A and 2B are sectional views depicting the manufacturing method of the wiring substrate in accordance with the preliminary matters (2 thereof)

FIGS. 13A and 13B are partially enlarged sectional views depicting the formation method of the second wiring layer (2 thereof).

DETAILED DESCRIPTION

Hereinafter, an exemplary embodiment will be described with reference to the accompanying drawings.

Before describing the exemplary embodiment, preliminary matters, which are bases of the present disclosure, are first described. It should be noted that the preliminary matters relate to personal investigation contents of the inventor and include a novel technology, not a known technology FIGS. 1A to 3 illustrate a manufacturing method of a wiring substrate in accordance with the preliminary matters. In the manufacturing method of the wiring substrate in accordance with the preliminary matters, in order to form a fine multi-layered wiring layer, an insulation layer is formed of a photosensitive resin, and a seed layer of a thin film is formed by a sputtering method when forming a wiring layer by a semi-additive method.

Figure 1A:
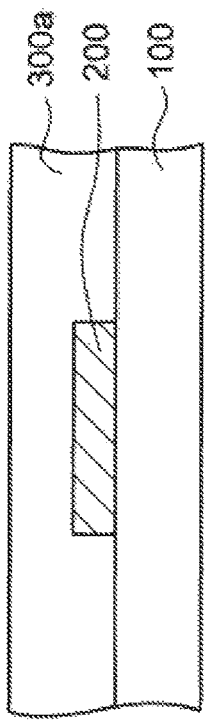
FIGS. 1A to 1C are sectional views depicting a manufacturing method of a wiring substrate in accordance with preliminary matters (1 thereof).

As shown in FIG. 1A, a substrate 100 having a first wiring layer 200 formed thereon is first prepared. Then, a photosensitive resin layer 300a is formed on the substrate 100 and the first wiring layer 200.

Figure 1B:
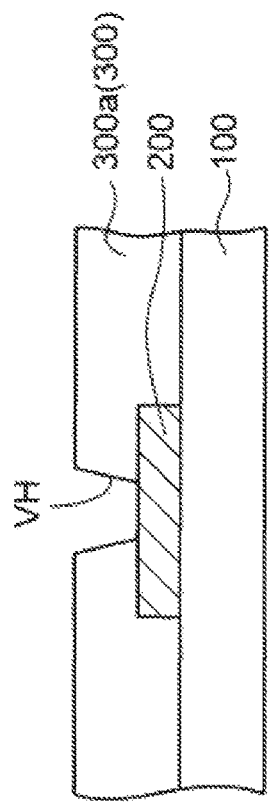

Also, as shown in FIG. 1B, the photosensitive resin layer 300a is subjected to exposure and developing processing on the basis of a photolithography, so that a via hole VH reaching the first wiring layer 200 is formed in the photosensitive resin layer 300a. Thereafter, the photosensitive resin layer 300a is cured by a heating treatment, so that an insulation layer 300 is obtained.

At this time, resin smear (residue of the resin) remains in the via hole VH, so that it is necessary to remove the resin smear so as to obtain favorable via connection, Here, in the related art, a method of forming an insulation layer having a via hole by using a non-photosensitive resin layer having no photosensitivity and laser-processing the non-photosensitive resin layer has been known. In this case, in order to remove the resin smear remaining in the via hole VH, desmear processing in which a potassium permanganate solution or the like is used is generally performed.

Figure 1C:
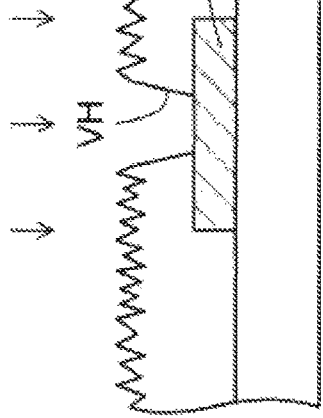

The inventor experimentally performed the desmear processing in the via hole VH, after the process of FIG. 1B. As a result, as shown in FIG. 1C, the inventor found out that the insulation layer 300 formed of the photosensitive resin layer 300a is not resistant to the alkali solution (potassium permanganate solution), so that a surface of the insulation layer 300 is considerably roughened by the desmear processing.

On the insulation layer 300, a second wiring layer, which is connected to the first wiring layer 200 through the via hole VH, is formed. For this reason, when the surface of the insulation layer 300 is considerably roughened, it is difficult to reliably form the fine second wiring layer on the insulation layer 300.

Therefore, the inventor performed a test for investigating whether the desmear processing can be omitted after the process of FIG. 1B. As shown in FIG. 2A, after the process of FIG. 1B, a seed layer 400 was formed in the via hole VH and on the insulation layer 300 by the sputtering method without performing the desmear processing. As the seed layer 400, a titanium (Ti) layer having a thickness of 30 nm and a copper (Cu) layer having a thickness of 200 nm were formed in corresponding order from below.

Also, a copper plated layer 500 of a thick film was formed on an entire surface of the seed layer 400 by an electrolytic plating, so that a second wiring layer 220 was pseudo-formed by the seed layer 400 and the copper plated layer 500. At this time, a diameter of the via hole VH was 75 μm.

Then, the inventor performed a peeling test (QVP (Quick Via Pull test)) so as to check the adhesion strength of the via connection between the first wiring layer 200 and the seed layer 400 of the second wiring layer 220 in the via hole VH. As a result, as shown in FIG. 29, the seed layer 400 of the via hole VH was peeled off from the first wiring layer 200, and the yield in the substrate 100 was 0%.

Figure 3:
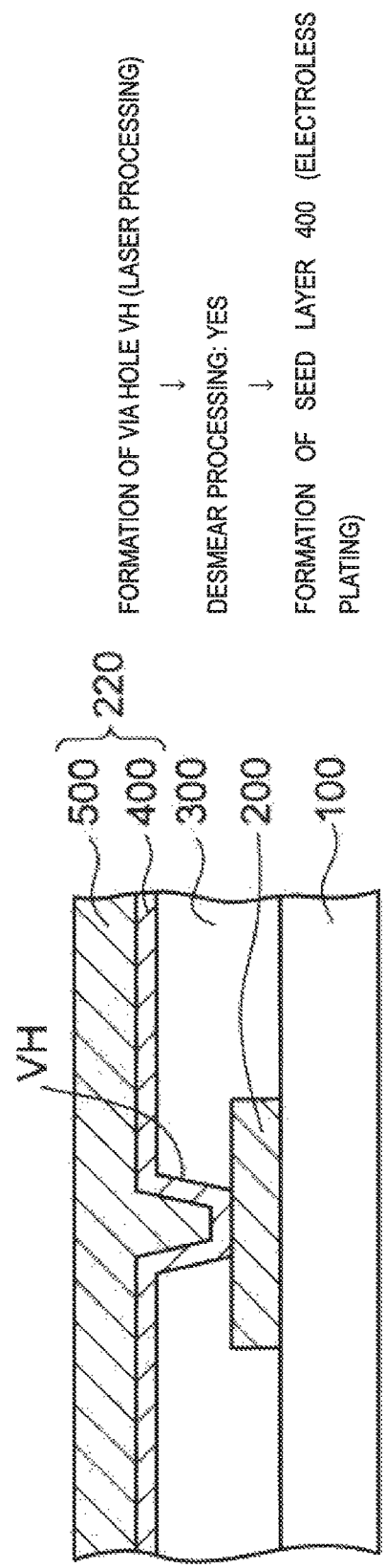
FIG. 3 is a sectional view depicting a manufacturing method of a wiring substrate in accordance with a comparative example of the preliminary matters.

FIG. 3 depicts a sample of a comparative example. As shown in FIG. 3, in the sample of the comparative example, the insulation layer 300 formed of the non-photosensitive resin layer was formed therein with the via hole VH by laser processing.

Also, after the via hole VH was subjected to the desmear processing, the seed layer 400 was formed of copper by an electroless plating, the copper plated layer 500 was formed on the entire surface of the seed layer 400 by the electrolytic plating, so that the second wiring layer 220 was pseudo-formed.

The same peeling test was performed for the sample of the comparative example. As a result, the seed layer 400 in the via hole VH was not peeled off from the first wiring layer 200, and the yield in the substrate 100 was favorably 97.6% to 99.9%, From the above, it can be seen that it is necessary to perform the processing of removing the resin smear in the via hole VH, even in the manufacturing method of forming the insulation layer 300 having the via hole VH from the photosensitive resin layer 300a.

The above problems can be solved by a manufacturing method of a wiring substrate in accordance with an exemplary embodiment to be described later.

The inventor found out a manufacturing method capable of preventing a surface of an insulation layer formed of a photosensitive resin from being excessively roughened, removing resin smear in a via hole, and roughening a surface of a first wiring layer in the via hole at the same time.

Exemplary Embodiment

Figure 16:
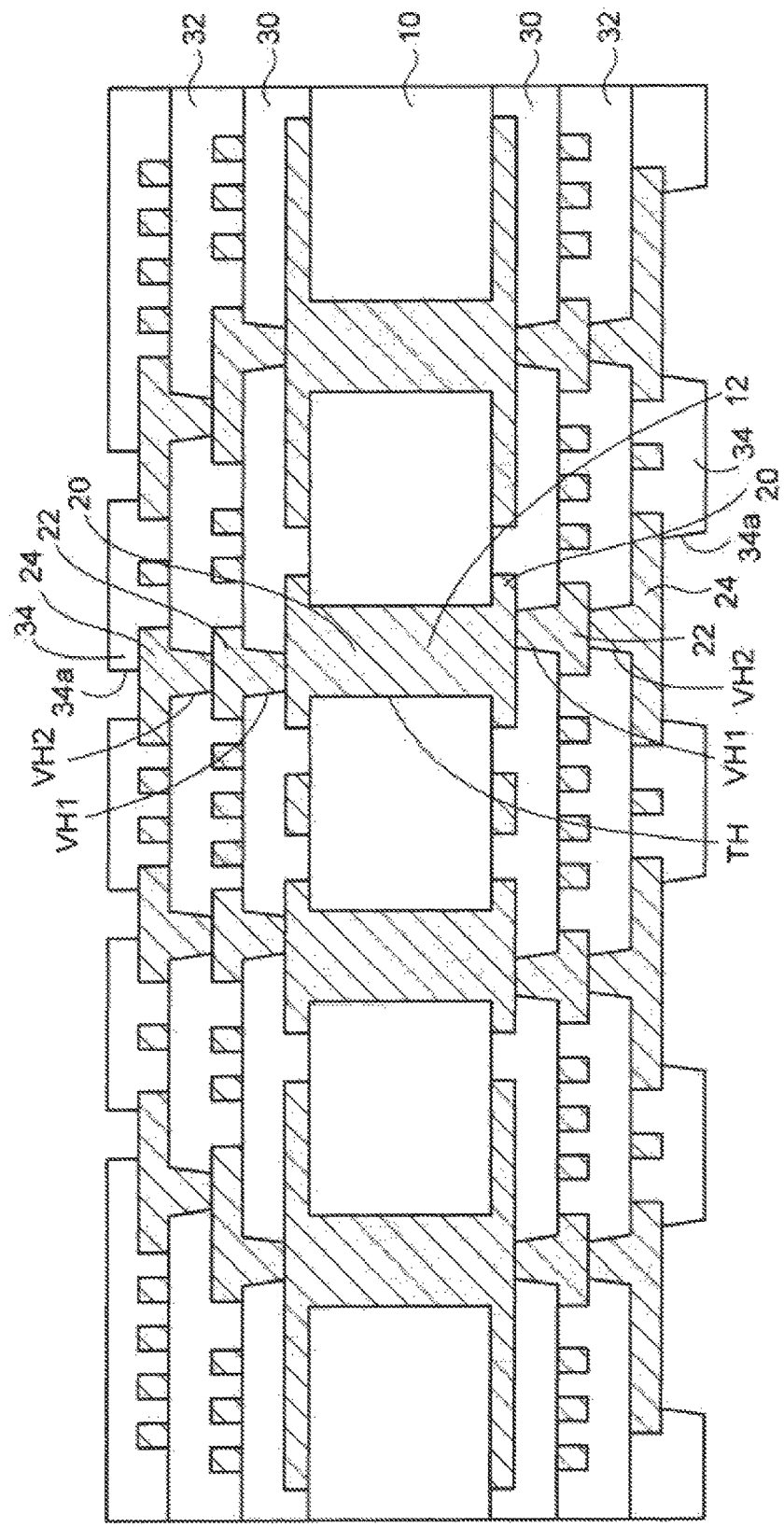
FIG. 16 is a sectional view depicting the manufacturing method of the wiring substrate in accordance with the exemplary embodiment (8 thereof).
Figure 17:
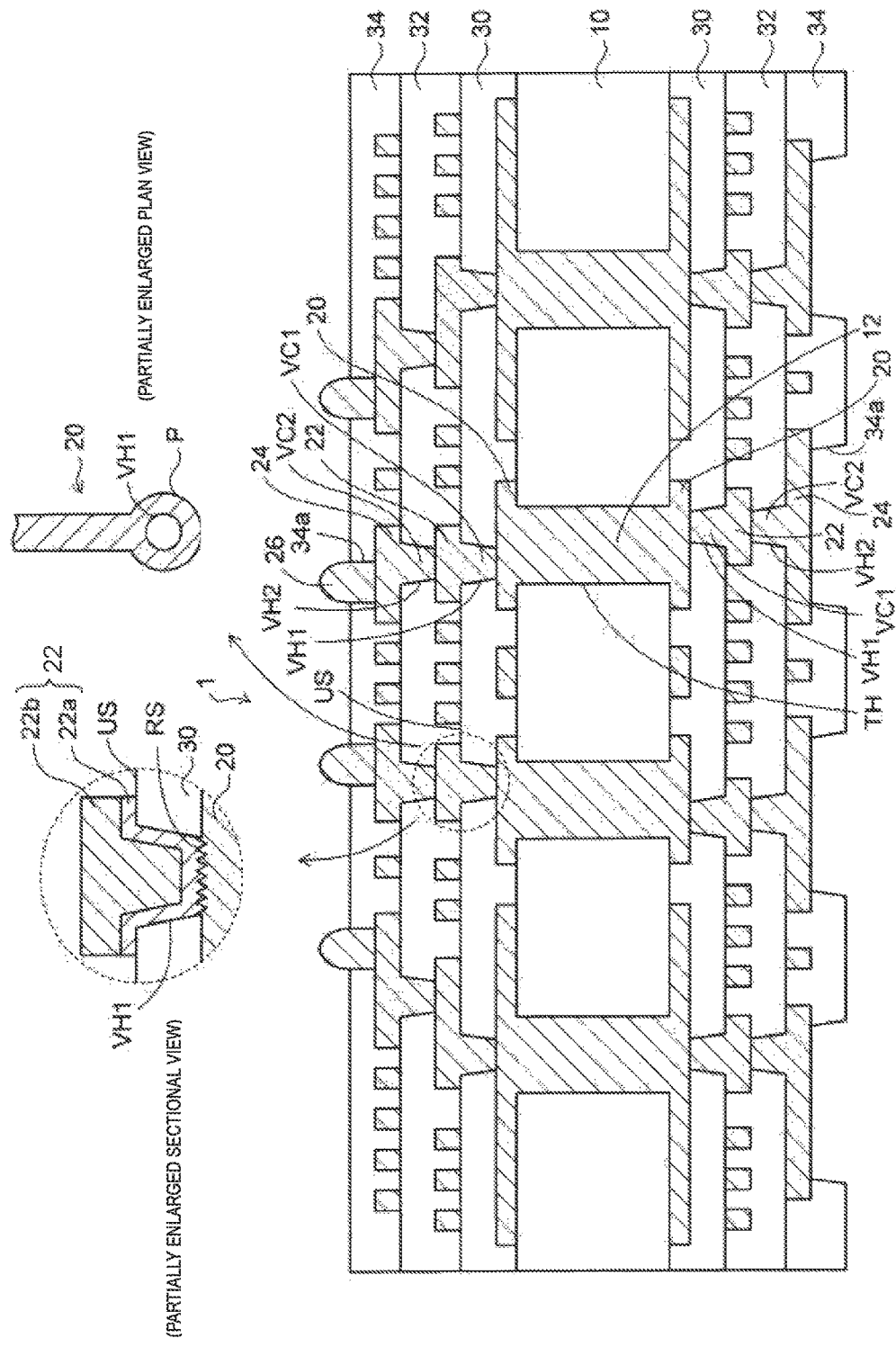
FIG. 17 is a sectional view depicting a wiring substrate in accordance with the exemplary embodiment.
Figure 18:
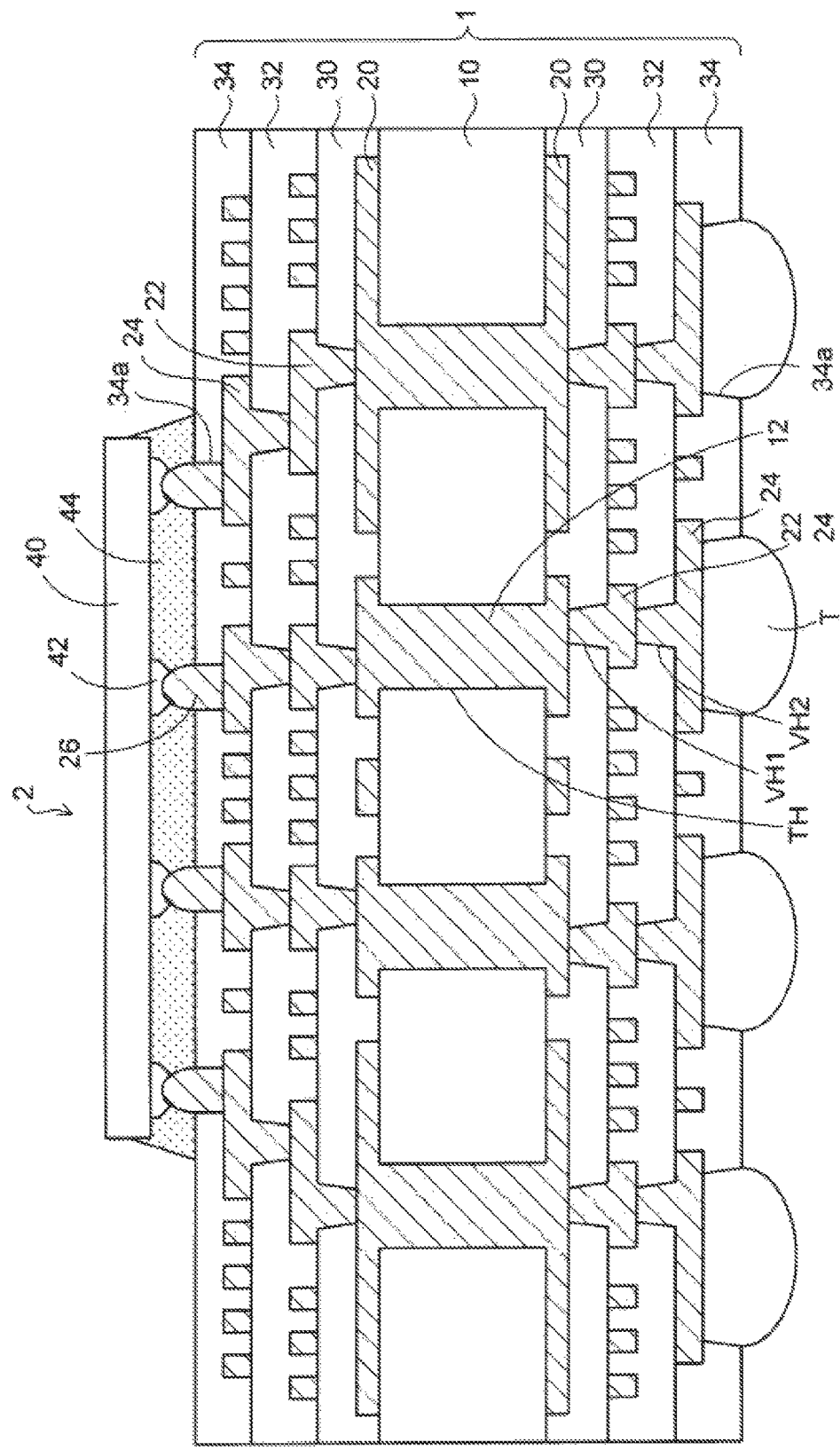
FIG. 18 is a sectional view depicting an electronic component device in accordance with the exemplary embodiment.

FIGS. 4 to 16 illustrate a manufacturing method of a wiring substrate in accordance with an exemplary embodiment, FIG. 17 depicts a wiring substrate of the exemplary embodiment, and FIG. 18 depicts an electronic component device of the exemplary embodiment.

In the below, structures of the wiring substrate and the electronic component device are described while describing the manufacturing method of the wiring substrate.

Figure 4:
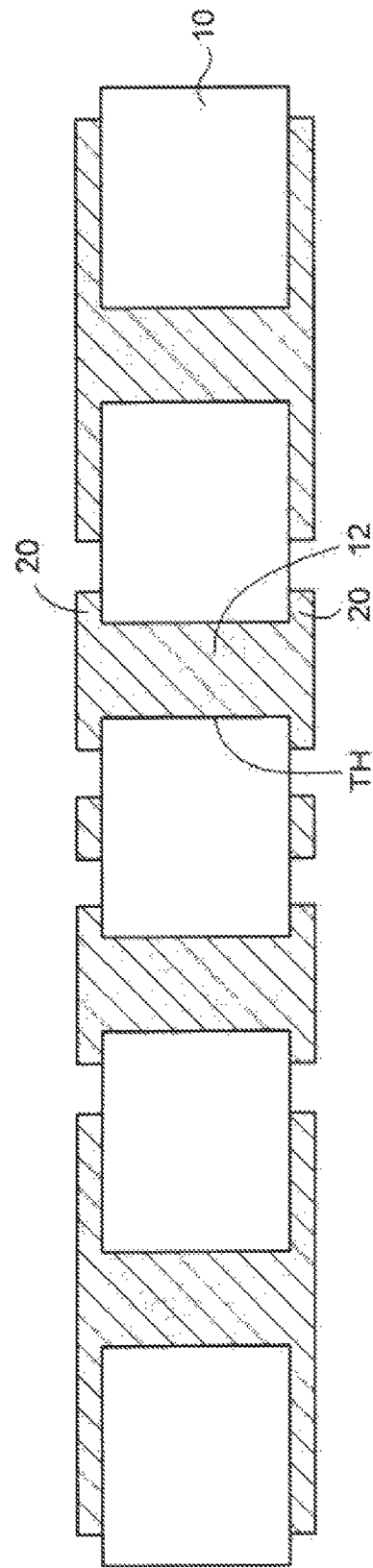
FIG. 4 is a sectional view depicting a manufacturing method of a wiring substrate in accordance with an exemplary embodiment (1 thereof).

In the manufacturing method of the wiring substrate in accordance with the exemplary embodiment, a core substrate 10 having a structure as shown in FIG. 4 is first prepared. The core substrate 10 is formed of an insulation material, preferably prepreg.

The prepreg is formed by impregnating a resin such as an epoxy resin into glass woven fabric (glass cloth), glass non-woven fabric, aramid fiber or the like. The semi-cured prepreg is heated and cured to obtain the core substrate 10. In addition to the epoxy resin, the other resins such as bismaleimide triazine resin, polyimide resin and the like may also be used.

Both the surfaces of the core substrate 10 are formed with first wiring layers 20, respectively. The core substrate 10 is formed with through-holes TH penetrating the same in a thickness direction. The first wiring layers 20 on both the surfaces are interconnected by through-conductors 12 formed in the through-holes TH.

Alternatively, a through-hole plating layer may be formed on inner walls of the through-holes TH of the core substrate 10, and the remaining portions of the through-holes TH may be filled with a resin. In this case, the first wiring layers 20 on both the surfaces are interconnected by the through-hole plating layer.

The through-holes TH are formed by drill or laser. The first wiring layer 20 and the through-conductor 12 are made of copper, and are formed using a photolithography, a plating technology, a wet etching, and the like.

Also, the first wiring layers 20 on both the surfaces of the core substrate 10 are treated with a formic acid solution, so that surfaces and side surfaces of the first wiring layers 20 are roughened. The first wiring layers 20 are roughened, so that a first insulation layer, which will be formed in a next process, is formed with good adhesion to the first wiring layers 20.

Alternatively, instead of the treatment using the formic acid solution, a silane coupling-based organic film may be formed on the core substrate 10 and the first wiring layer 20. The organic film includes, in molecules, a functional group to reaction-bond with an organic material and a functional group to reaction-bond with an inoragnic material, and has a function of coupling the organic material and the inorganic material.

Thereby, the first wiring layer 20 (copper) and the first insulation layer (resin) to be formed thereon are formed with good adhesion by the organic film.

The organic film is formed by a dip coating or spray treatment, and a thickness thereof is about 5 nm to 1000 nm.

Figure 5:
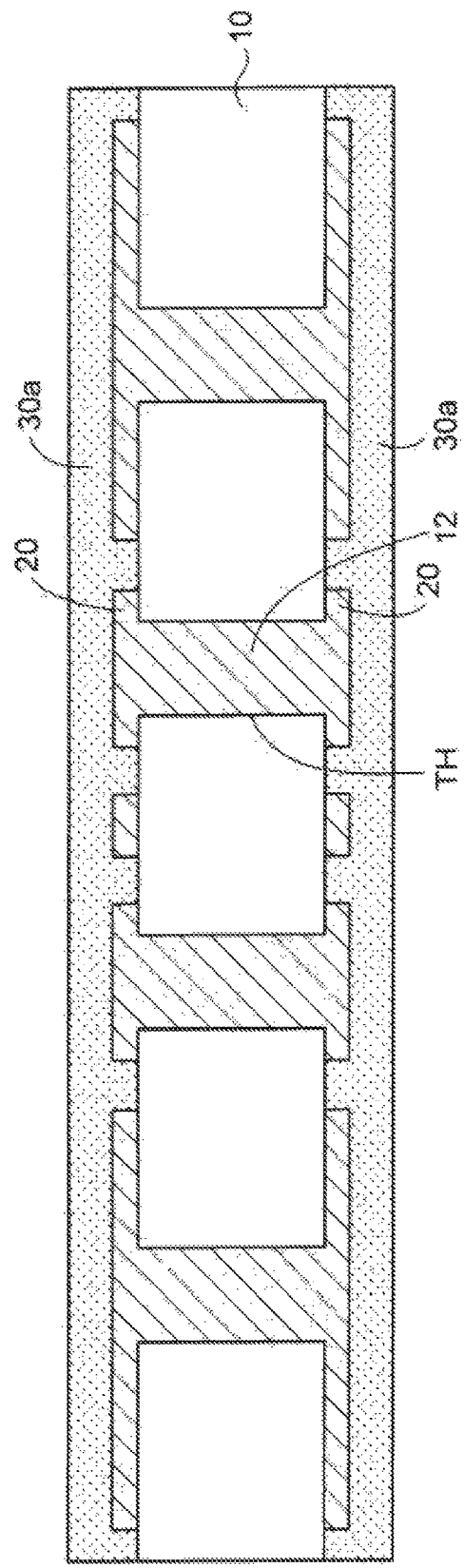
FIG. 5 is a sectional view depicting the manufacturing method of the wiring substrate in accordance with the exemplary embodiment (2 thereof).

Then, as shown in FIG. 5, photosensitive resin layers 30a for covering the first wiring layers 20 on both the surfaces of the core substrate 10 are respectively formed. A thickness of the photosensitive resin layer 30a is 5 μm to 30 μm, for example. As the photosensitive resin layer 30a, an ester-based, phenol-based, polyimide-based or epoxy-based resin may be used.

Also, as the formation method of the photosensitive resin layer 30a, a resin film may be stacked by press processing using a vacuum laminator device or the like or a liquid resin may be applied. When applying the liquid resin, a spin coating, a spray coating, a slit coating or a printing may be performed.

Also, the photosensitive resin layer 30a may be a negative-type or a positive-type. In the case of the negative-type, an exposed part to which light has been irradiated is altered from a soluble property to an insoluble property by a crosslinking reaction, and a non-exposed part is removed by a developing solution. On the contrary, in the case of the positive-type, an exposed part to which light has been irradiated is chemically changed from an alkali-insoluble property to an alkali-soluble property and is removed by the developing solution. In the exemplary embodiment, the negative-type photosensitive resin layer 30a is used.

A first heating treatment (pre-bake) is performed for the photosensitive resin layer 30a at low temperatures of 50° C. to 100° C., so that solvent in the photosensitive resin layer 30a is removed. Thereby; the photosensitive resin layer 30a is temporarily bonded on the core substrate 10 and the first wiring layer 20.

Figure 6:
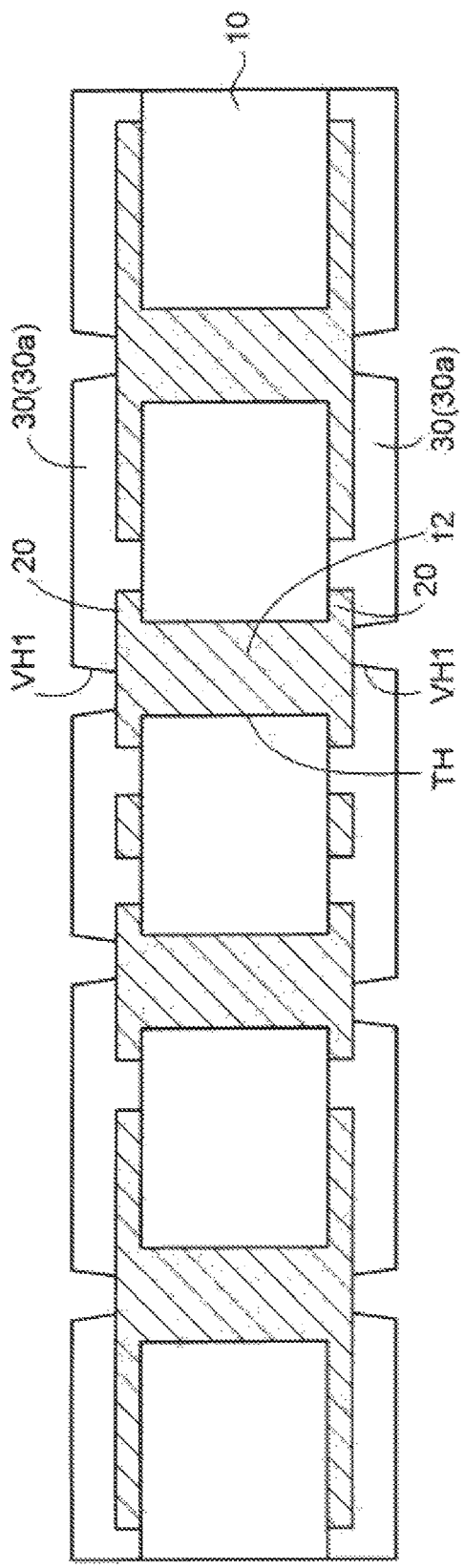
FIG. 6 is a sectional view depicting the manufacturing method of the wiring substrate in accordance with the exemplary embodiment (3 thereof).

Then, as shown in FIG. 6, the photosensitive resin layer 30a of an upper surface side of the core substrate 10 is exposed by irradiating thereto ultraviolet via a photomask (not shown). Also, the photosensitive resin layer 30a of a lower surface side of the core substrate 10 is exposed by irradiating thereto the ultraviolet via the photomask (not shown).

Thereafter, the exposed photosensitive resin layers 30a are treated with a developing solution. At this time, in the case that the negative-type photosensitive resin layer 30a is used, non-exposed parts of the photosensitive resin layers 30a of both the surfaces-side of the core substrate 10 are solved and removed by the developing solution. Thereby, the photosensitive resin layers 30a of both the surfaces-side are formed therein with first via holes VH1 reaching the first wiring layers 20, respectively.

In the case that the negative-type photosensitive resin layer 30a is used, an inorganic alkali solution such as sodium carbonate (carbonic soda), sodium hydroxide (caustic soda) or the like is used as the developing solution. Also, in the case of the positive-type photosensitive resin layer, an organic alkali solution such as TMHA (tetra methyl ammonium hydroxide) is used as the developing solution.

The photosensitive resin layer 30a includes a reactive functional group, which contributes to photo-curing, and a reactive functional group, which contributes to thermal curing, and is cured by the photo-curing and thermal curing.

Also, the photo-cured part is completely cured by irradiating thereto ultraviolet from an ultraviolet (UV) irradiation device. Then, a second heating treatment (post bake) is performed for the photosensitive resin layer 30a at high temperatures of 120° C. to 200° C. by using a hot-air drying furnace, so that the thermally cured part is completely cured.

By the above, the photosensitive resin layers 30a are exposed and developed, so that first insulation layers 30 having the first via holes VH1 reaching the first wiring layers 20 are formed on the core substrate 10 and the first wiring layers 20. The first insulation layers 30 are respectively formed at both the surfaces-side of the core substrate 10.

A diameter of the first via hole VH1 is set to about 5 μm to 15 μm, for example. Also, an aspect ratio (height/diameter) of the first via hole VH1 is set to 1 to 6.

The first insulation layer 30 is formed from the photosensitive resin layer 30a, so that it is possible to reduce the diameter of the via holes and to arrange the via holes with a narrower pitch, as compared to the method of forming the via holes by laser processing the non-photosensitive resin layer.

As described in the preliminary matters, at this point of time, the resin smear (residue of the resin) remains on the surface of the first wiring layer 20 in the first via hole VH1. For this reason, it is necessary to remove the resin smear remaining on the surface of the first wiring layer 20 in the first via hole VH1 without roughening a surface of the first insulation layer 30 formed from the photosensitive resin layer 30a.

The inventor found out that when a formic acid solution is used, the surface of the first wiring layer 20 (copper) in the first via hole VH1 can be appropriately etched to remove the resin smear and the surface of the first insulation layer 30 formed from the photosensitive resin layer 30a is not roughened.

Also, at the same time, when the formic acid solution is used, a concavity and convexity is formed upon the etching of the surface of the first wiring layer 20 (copper) in the first via hole VH1, so that a roughened surface is obtained.

The formic acid solution may be a solution in which a formic acid is included as a main component, and the other chemical agents may be added thereto.

Figure 7:
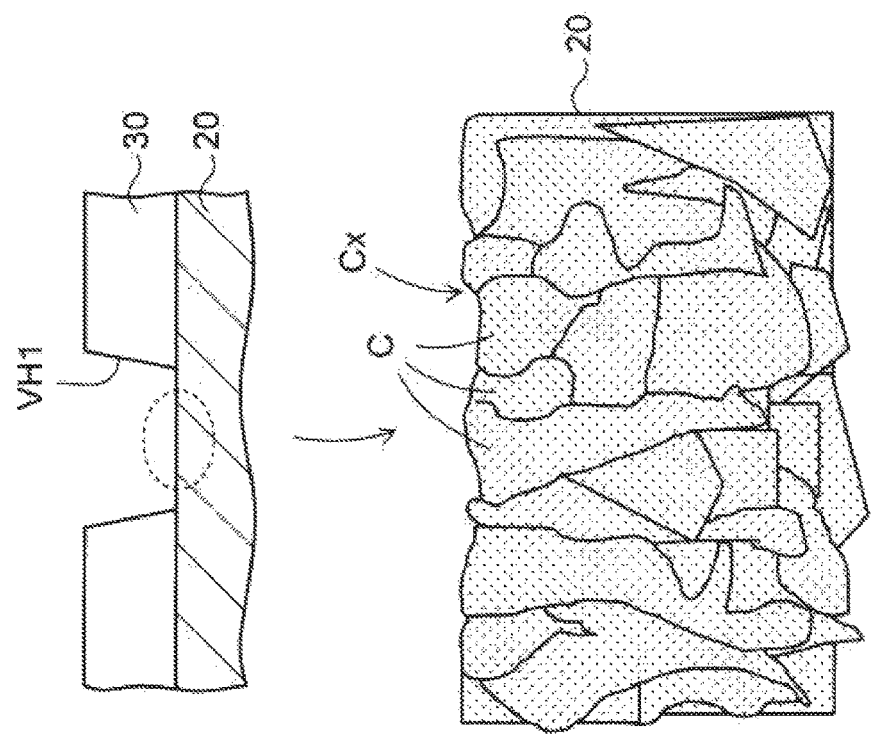
FIG. 7 is a partially enlarged sectional view depicting a shape of a first wiring layer in a first via hole of FIG. 6.

FIG. 7 is a partially enlarged sectional view depicting a shape of the first wiring layer 20 in the first via hole VH1 of FIG. 6 before a treatment is performed using the formic acid solution.

As shown in FIG. 7, the first wiring layer 20 (copper layer) is an aggregate (polycrystalline body) consisting of copper crystal particles C having different orientations. Grain boundary parts Cx, which are interface parts of the adjacent crystal particles C, extend in a thickness direction from the surface.

Figure 8:
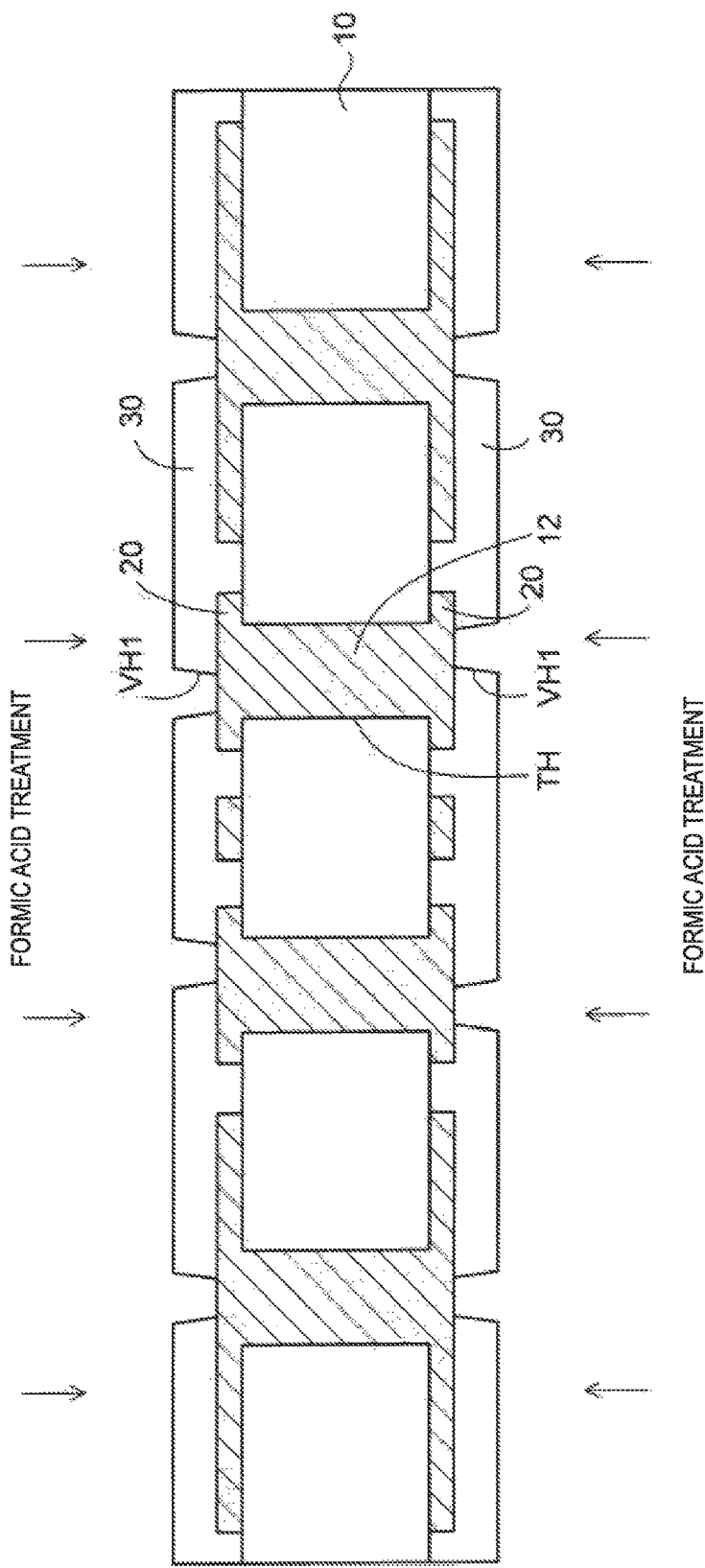
FIG. 8 is a sectional view depicting the manufacturing method of the wiring substrate in accordance with the exemplary embodiment (4 thereof)

Subsequently, as shown in FIG. 8, insides of the first via holes VH1 and the surfaces of the first insulation layer 30 of both the surfaces-side of the structure shown in FIG. 6 are processed with the formic acid solution. The treatment using the formic acid solution is performed by a dip treatment of dipping a workpiece into a chemical solution in a bath or a spray treatment of spraying a chemical solution to a workpiece.

Figure 9:
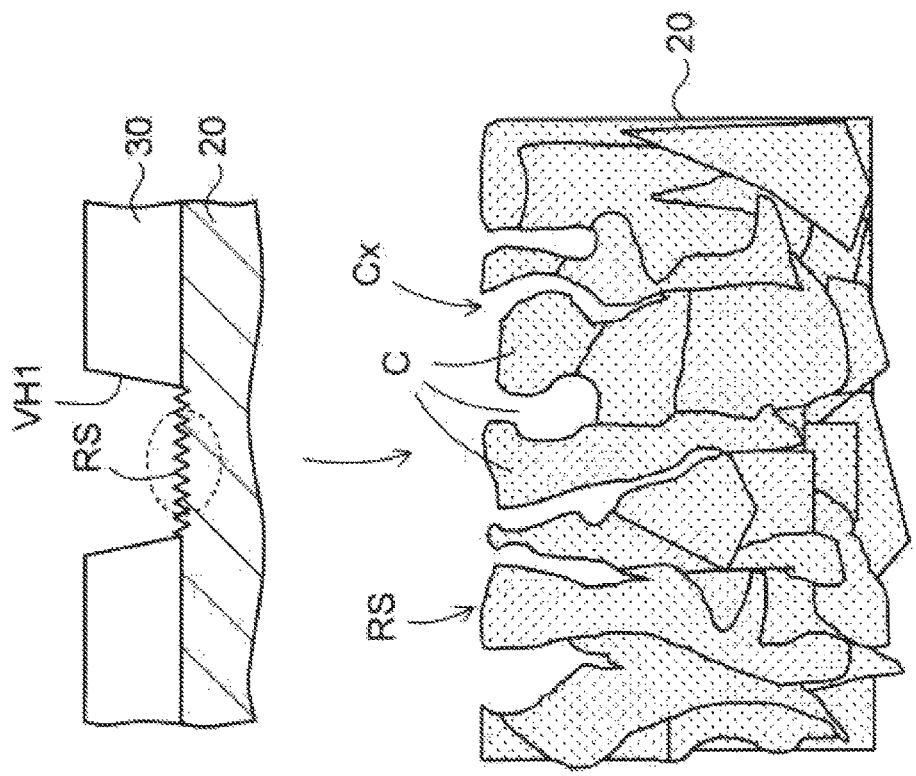
FIG. 9 is a partially enlarged sectional view depicting a shape after a surface of the first wiring layer in the first via hole of FIG. 7 is treated with a formic acid solution.

FIG. 9 is a partial sectional view depicting a shape of the first wiring layer 20 in the first via hole VH1 of FIG. 7 after the treatment has been performed using the formic acid solution.

As shown in FIG. 9, when etching the surface of the first wiring layer 20 in the first via hole VH1 of FIG. 7 with the formic acid solution, an etching rate is higher at the grain boundary parts Cx than at main body parts of the crystal particles C of the copper layer.

For this reason, the grain boundary parts Cx of the crystal particles C of the copper layer are etched from the surface in the thickness direction, so that a fine concavity and convexity is formed in the surface of the first wiring layer 20 (copper layer) and a roughened surface RS is thus formed. At this time, a surface roughness (Ra) of the roughened surface RS of the first wiring layer 20 in the first via hole VH1 is set to 30 nm to 600 nm, preferably, 100 nm.

An etching depth (a depth of the concave portion) from the surface of the first wiring layer 20 by the formic acid solution is set to 5% to 40% of the thickness of the first wiring layer 20, for example, 0.1 μm to 2.0 μm. A thickness of the first wiring layer 20 is 2 μm to 5 μm, for example.

In the process of FIG. 4, in the case that the surface and side surfaces of the first wiring layer 20 are entirely roughened with the formic acid solution, the surface of the first wiring layer 20 in the first via hole VH1 is etched twice by the formic acid solution. In this case, each treatment condition is adjusted so that a concave portion of a desired depth is formed in the surface of the first wiring layer 20 in the first via hole VH1 by the twice treatment of the formic acid solution.

Thereby, the resin smear remaining on the surface of the first wiring layer 20 in the first via hole VH1 is removed simultaneously when etching the first wiring layer 20. Also, since the surface of the first wiring layer 20 in the first via hole VH1 is formed as the roughened surface RS, it is possible to form a seed layer of a second wiring layer with good adhesion by an anchor effect.

The surface roughness (Ra) of the first wiring layer 20 in the first via hole VH1 is greater than a surface roughness (Ra) of the first wiring layer 20 in a region other than the first via hole VH1.

In this way, the roughened surface RS of the first wiring layer 20 is formed with the concavity and convexity by gaps, which are formed along the grain boundary parts Cx of the crystal particles C of the copper layer in the thickness direction from the surface of the copper layer.

In the process of FIG. 4, in the case that the first wiring layer 20 is roughened with the formic acid solution, since the surface of the first wiring layer 20 in the first via hole VH1 is etched twice by the formic acid solution, the surface roughness (Ra) thereof is greater than that of the other region of the first wiring layer 20.

Also, in the process of FIG. 4, in the case that a silane coupling-based organic film is formed, the first wiring layer 20 of the region other than the first via hole VH1 is not etched by the formic acid solution.

In this case, the surface of the first wiring layer 20 of the region other than the first via hole VH1 is a surface of the electrolytic copper plated layer, which has not been roughened, and a surface roughness (Ra) thereof is 1 nm or greater and less than 30 nm.

Also, at this time, the surface of the first insulation layer 30 formed of the photosensitive resin layer 30a is little etched by the formic acid solution, so that the surface roughening is not generated. A surface roughness (Ra) of the first insulation layer 30 (resin) treated with the formic acid solution is or greater and less than 30 nm, and is substantially the same as the surface roughness (Ra) before the treatment is performed using the formic acid solution. Also, the surface roughening due to the formic acid solution is not generated on the inner wall of the first via hole VH1, too.

In this way, when the treatment is performed using the formic acid solution, the surface roughening is not generated on the first insulation layer 30, the resin smear on the surface of the first wiring layer 20 in the first via hole VH1 can be removed, and a connection part of the first wiring layer 20 can be formed as the roughened surface RS.

Figure 10:
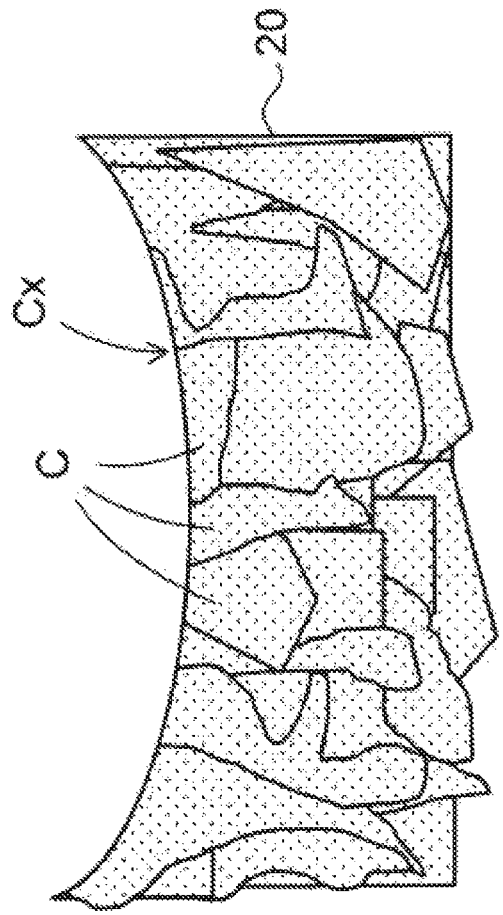
FIG. 10 is a partially enlarged sectional view depicting a shape after the surface of the first wiring layer in the first via hole of FIG. 7 is treated with a sodium sulfate solution (comparative example).

FIG. 10 depicts a shape after the surface of the first wiring layer 20 in the first via hole VH1 of FIG. 7 is soft-etched with a sodium sulfate solution, as a comparative example.

As described above, in the method of forming the via hole by laser processing the non-photosensitive resin layer the resin smear on the surface of the wiring layer in the via hole is removed by the desmear processing. However, the resin smear cannot be completely removed only by the desmear processing. Therefore, after the desmear processing, the surface of the wiring layer in the via hole is further etched with the sodium sulfate solution so as to completely remove the resin smear.

As shown in FIG. 10, when etching the surface of the first wiring layer 20 in the first via hole VH1 with the sodium sulfate solution, the etching rate is substantially the same at the main body parts and the grain boundary parts Cx of the crystal particles C of the copper layer.

For this reason, the surface of the first wiring layer 20 after it is etched with the sodium sulfite solution is a smooth curved surface with no concavity and convexity.

Like this, when the sodium sulfate solution is used, unlike the exemplary embodiment, the surface of the first wiring layer 20 in the first via hole VH1 is etched to remove the resin smear but the surface of the first wiring layer 20 is not formed with the concavity and convexity for obtaining the anchor effect.

In the meantime, in the desmear processing in which a potassium permanganate solution or the like is used, the resin smear can be removed but the wiring layer (copper layer) is little etched. Therefore, even when the etching is performed with the sodium sulfate solution after the desmear processing, the surface of the first wiring layer 20 in the first via hole VH1 is not formed with the concavity and convexity as shown in FIG. 9 and the roughened surface cannot be obtained.

Figure 11:
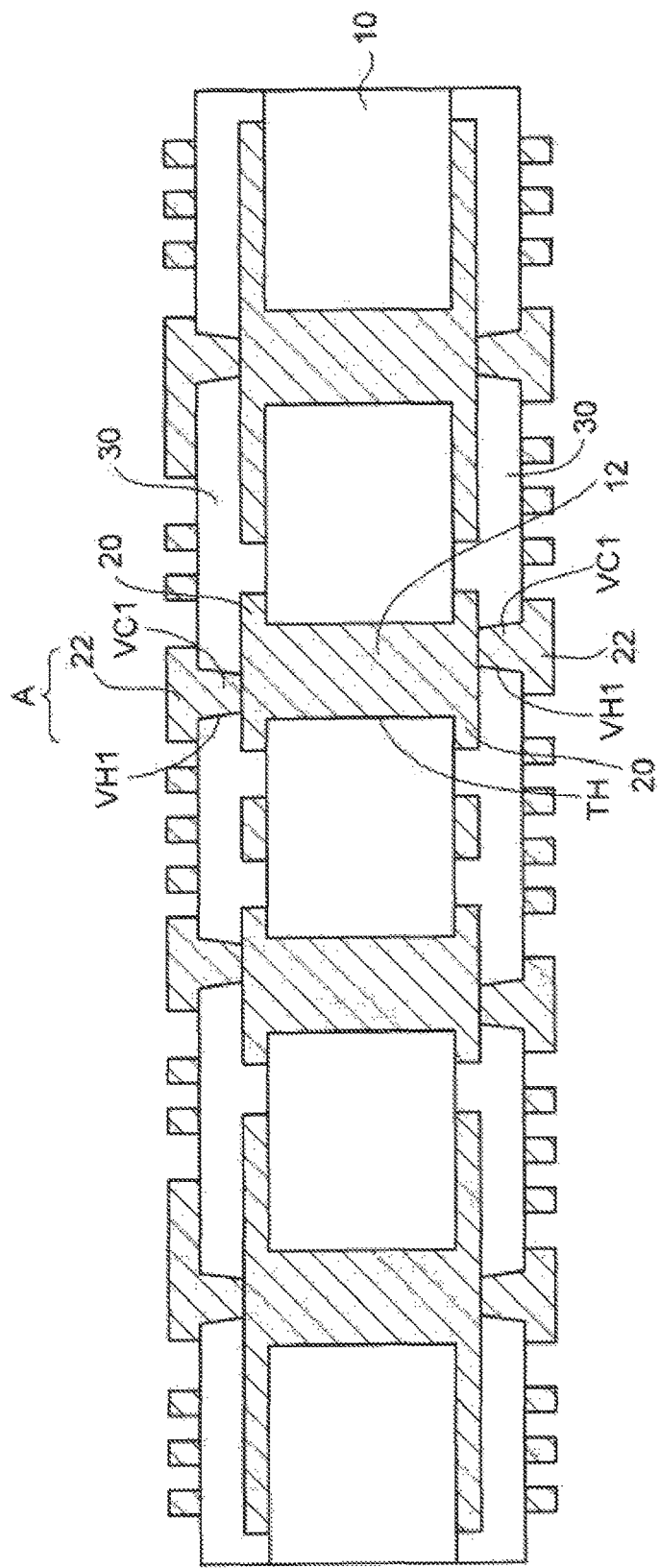
FIG. 11 is a sectional view depicting the manufacturing method of the wiring substrate in accordance with the exemplary embodiment (5 thereof).

Subsequently, as shown in FIG. 11, second wiring layers 22 are formed on the first insulation layers 30 of both the surfaces-side of the core substrate 10. The second wiring layer 22 is connected to the first wiring layer 20 through a via conductor VC1 in the first via hole VH1.

A formation method of the second wiring layer 22 is described in detail with reference to FIGS. 12A to 13B. In FIGS. 12A to 13B, a part corresponding to a region A of FIG. 11 is partially shown with being enlarged. The second wiring layer 22 is formed by a semi-additive method. In FIGS. 12A to 13B, the indication of roughness of the roughened surface of the first wiring layer 20 in the first via hole VH1 is omitted.

Figure 12A:
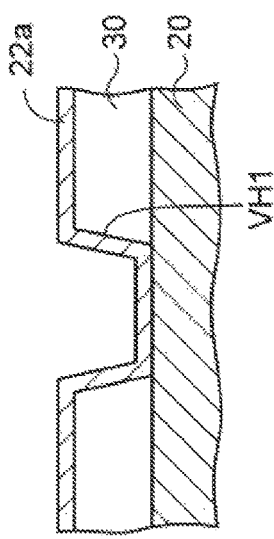
FIGS. 12A to 12C are partially enlarged sectional views depicting a formation method of a second wiring layer (I thereof).

As shown in FIG. 12A, a seed layer 22a is first formed in the first via hole VH1 and on the first insulation layer 30 by a sputtering method.

In the sputtering method, an inert gas is introduced under vacuum into a chamber, and a high voltage is applied to a target for discharge. Then, ions are accelerated and bombarded to the target, so that atoms of the target material are expelled and attached to a substrate and a film is thus formed thereon.

The seed layer 22a is formed as a stacked film of a titanium (Ti) layer/a copper (Cu) layer in corresponding order from below. A thickness of the Ti layer is 30 nm, and a thickness of the Cu layer is 200 nm to 500 nm.

The Cu layer formed by the sputtering method has the poor adhesion to the first insulation layer 30 (resin). For this reason, a titanium (Ti) layer, a nickel (Ni) layer, a chromium (Cr) layer or an alloy layer including at least one thereof having the favorable adhesion to the first insulation layer 30 (resin) is formed as an adhesion layer between the first insulation layer 30 (resin) and the copper layer.

Figure 12B:
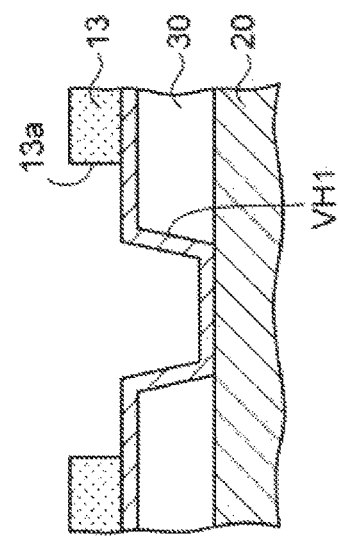

Also, as shown in FIG. 12B, a plated resist layer 13 having an opening 13a provided in a region in which the second wiring layer 22 is to be arranged is thrilled on the seed layer 22a. The opening 13a of the plated resist layer 13 is formed by performing exposure and developing on the basis of a photolithography.

The plated resist layer 13 may be formed by bonding a dry film resist or applying a liquid resist.

Figure 12C:
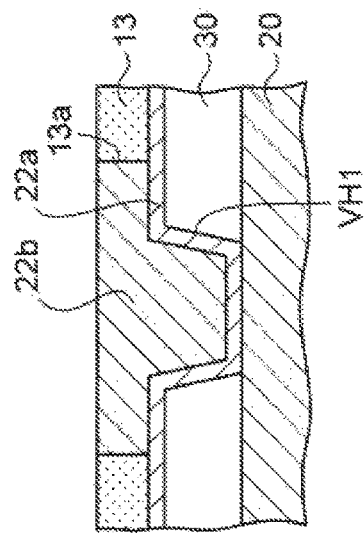

Then, as shown in FIG. 12C, a metal plated layer 22b is formed to fill the first via hole VH1 and the opening 13a of the plated resist layer 13 by an electrolytic plating in which the seed layer 22a is used as a power feeding path for plating. The metal plated layer 22b is formed of copper or the like.

Subsequently, as shown in FIG. 13A, the plated resist layer 13 is removed. Then, as shown in FIG. 13B, the seed layer 22a is etched using the metal plated layer 22b as a mask.

By the above, the second wiring layer 22 is formed by the seed layer 22a and the metal plated layer 22b.

As described above, the inside of the first via hole VH1 is treated with the formic acid solution, so that the resin smear is removed and the surface of the first wiring layer 20 in the first via hole VH1 is formed as the appropriately roughened surface RS.

For this reason, the seed layer 22a of the second wiring layer 22 is formed with good adhesion on the first wiring layer 20 in the first via hole VH1 by the anchor effect.

Therefore, when the peeling test is performed for the second wiring layer 22, like the above-described preliminary matters, the seed layer 22a of the second wiring layer 22 in the first via hole VH1 is not peeled off from the first wiring layer 20, and the sufficient adhesion strength of the via connection is obtained.

Also, since the resin smear does not remain on the surface of the first wiring layer 20 in the first via hole VH1, the second wiring layer 22 is reliably connected to the first wiring layer 20 in the first via hole VH1.

In particular, when the large-scale multiple core substrate 10 is used, since the yield of the via connection of the multi-layered wiring layer is favorable, it is possible to save the cost of the wiring substrate.

Also, as described above, when treating the inside of the first via hole VH1 with the formic acid solution, the surface of the first insulation layer 30 formed of the photosensitive resin layer 30a is not roughened, so that the surface of the first insulation layer 30 is smooth.

Also, as described above, when forming the seed layer 22a of the second wiring layer 22 by the sputtering method, a Ti layer, a Ni layer, a Cr layer or the like is formed as an adhesion layer. For this reason, it is possible to form the seed layer 22a on the smooth surface of the first insulation layer 30 with good adhesion.

Also, since the seed layer 22a of the second wiring layer 22 is formed by the sputtering method, it can be formed as a thin film, as compared to a case where the seed layer is formed by an electroless plating. For this reason, when etching the seed layer 22a by the semi-additive method, an etching amount is reduced, so that an undercut shape of a pattern of the seed layer 22a is suppressed and the thinning of the metal plated layer 22b is also reduced.

Also, since the surface of the first insulation layer 30 is smooth, it is possible to reduce an over-etching amount when etching the seed layer 22a by the semi-additive method.

For this reason, when forming the fine second wiring layer 22, a decrease in a pattern width of the second wiring layer 22, a pattern error and the like are prevented.

Thereby, for example, it is possible to reliably form the fine second wiring layer 22 having a thickness of 2 μm to 5 μm and a ratio of line (width) to space (interval) (−2 μm:2 μm) with high yield.

When the surface of the first insulation layer 30 (resin) is roughened and the concavity and convexity is thus formed by the desmear processing, unlike the exemplary embodiment, it is necessary to completely remove the seed layer 22a filled in the concave portions so as to prevent an electric short between wirings.

For this reason, it is necessary to increase an over-etching amount upon the etching of the seed layer. As a result, when forming a fine wiring layer, a pattern width may be decreased and a pattern error is likely to occur.

As described above, in the exemplary embodiment, since the first via holes VH1 are formed by the photolithography, it is possible to arrange the first via holes VH1 with a narrow pitch.

Also, as described above, since the second wiring layers 22 are formed by the semi-additive method in which the seed layer 22a of a thin film formed by the sputtering method is used, the second wiring layers can be formed with a fine pattern.

Therefore, since it is possible to form the fine wiring layers with the high density, it is possible to arrange bump electrodes of a narrow pitch corresponding to connection terminals of a high performance semiconductor chip.

Figure 14:
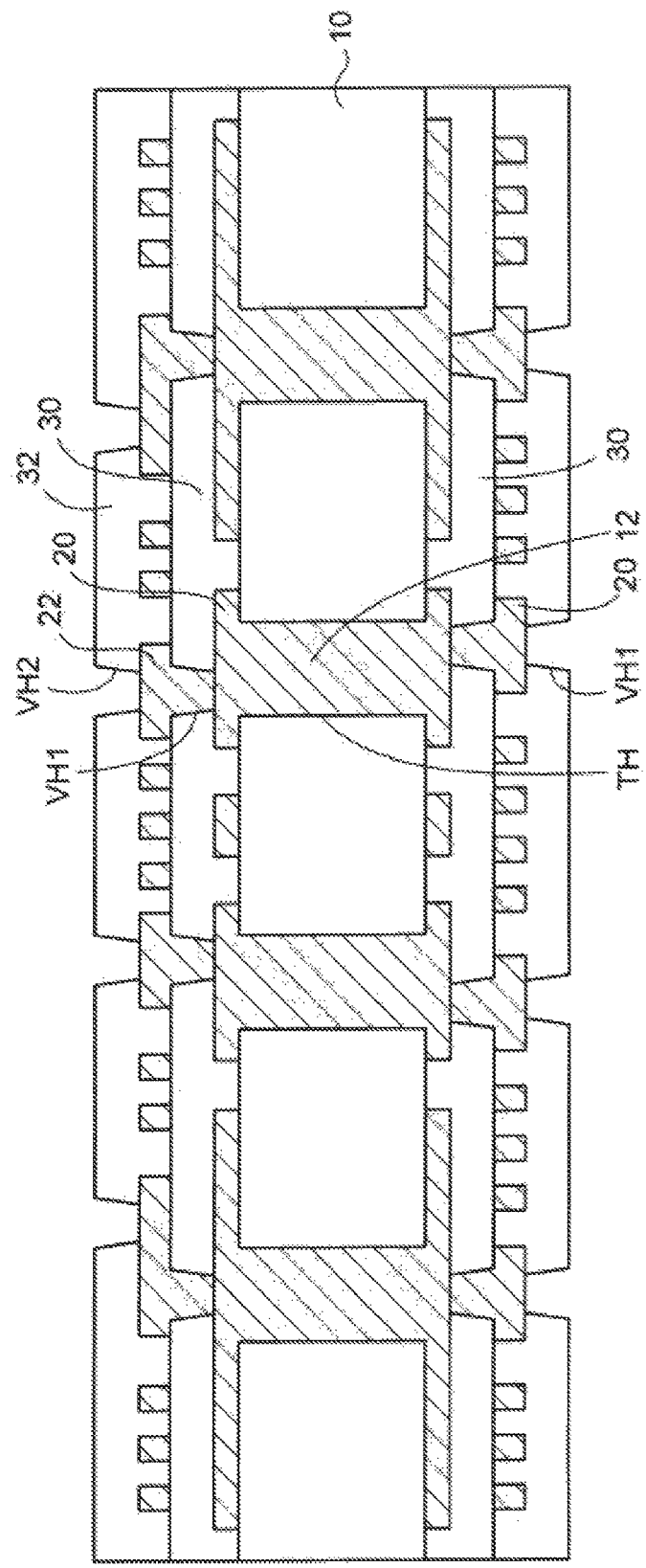
FIG. 14 is a sectional view depicting the manufacturing method of the wiring substrate in accordance with the exemplary embodiment (6 thereof).

Subsequently, as shown in FIG. 14, second insulation layers 32 are respectively formed on the first insulation layers 30 and the second wiring layers 22 of both the surfaces-side of the core substrate 10 by a method similar to the formation method of the first insulation layers 30 shown in FIGS. 5 and 6.

The second insulation layers 32 of both the surfaces-side are formed to have second via holes VH2 reaching the second wiring layers 22.

Also, insides of the second via holes VH2 are treated to remove resin smear with the formic acid solution by a method similar to the processes of FIGS. 8 and 9, and the surfaces of the second wiring layers 22 in the second via holes VH2 are formed as roughened surfaces.

Figure 15:
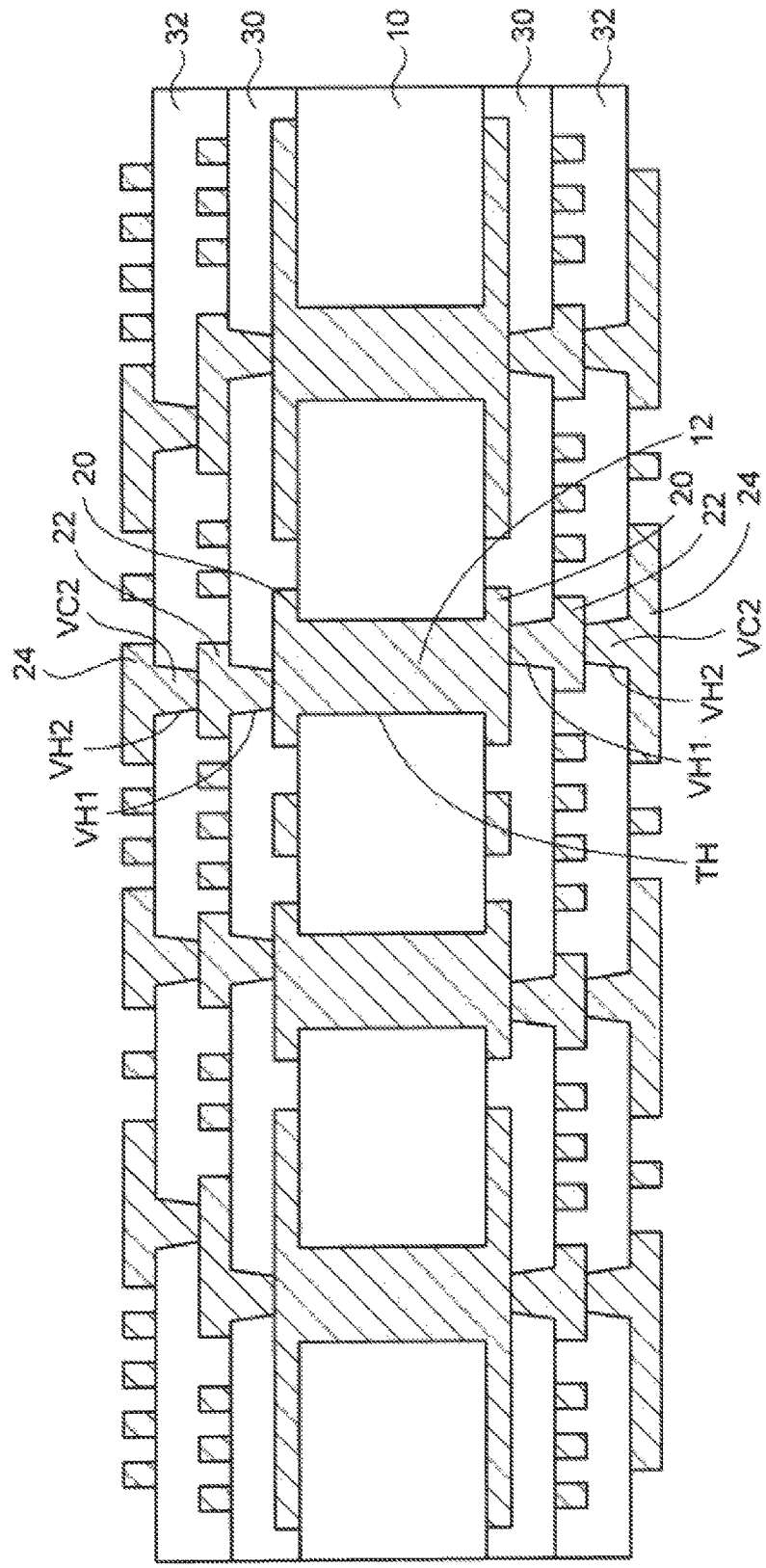
FIG. 15 is a sectional view depicting the manufacturing method of the wiring substrate in accordance with the exemplary embodiment (7 thereof).

Subsequently, as shown in FIG. 15, third wiring layers 24 are respectively formed on the second insulation layers 32 of both the surfaces-side of the core substrate 10 by a method similar to the formation method of the second wiring layers 22 shown in FIGS. 12A to 13B. The third wiring layers 24 of both the surfaces-side are connected to the second wiring layers 22 through via conductors VC2 in the second via holes VH2.

Then, as shown in FIG. 16, solder resist layers 34 having openings 34a provided on the third wiring layers 24 are respectively formed on the second insulation layers 32 of both the surfaces-side of the core substrate 10.

Also, contact layers (not shown) made of a nickel (Ni) plated layer/a gold (Au) plated layer and the like may be formed on the third wiring layers 24 in the openings 34a of the solder resist layers 34, as necessary.

Then, as shown in FIG. 17, bump electrodes 26 to connect to the third wiring layer 24 are formed in the openings 34a of the solder resist layer 34 of the upper surface side of the core substrate 10. The bump electrode 26 is formed of a solder ball, a solder plating or the like, for example.

By the above, a wiring substrate 1 of the exemplary embodiment is obtained.

As shown in FIG. 17, the wiring substrate 1 of the exemplary embodiment has the core substrate 10 having the structure described with reference to FIG. 4. Both the surfaces of the core substrate 10 are formed thereon with the first wiring layers 20, respectively. The first wiring layers 20 on both the surfaces are interconnected via the through-conductors 12 formed in the through-holes TH penetrating the core substrate 10.

Both the surfaces of the core substrate 10 are formed with the first insulation layers 30 having the first via holes VH1 reaching the first wiring layers 20. The first insulation layers 30 having the first via holes VH1 are formed by exposing and developing the photosensitive resin layers 30a on the basis of the photolithography.

As shown in a partially enlarged sectional view of FIG. 17, at both the surfaces-side of the core substrate 10, the surfaces of the first wiring layers 20 in the first via holes VH1 are formed as the roughened surfaces RS. The surface roughness (Ra) of the roughened surface RS of the first wiring layer 20 is set to 30 nm to 600 nm, preferably, 100 nm.

Also, as shown in a partially enlarged plan view of FIG. 17, a surface roughness (Ra) of the first wiring layer 20 (obliquely hatched region) of the region other than the first via hole VH1 is 1 nm or greater and less than 30 nm. That is, the surface roughness (Ra) of the first wiring layer 20 in the first via hole VH1 is set greater than the surface roughness (Ra) of the first wiring layer 20 (obliquely hatched region) of the region other than the first via hole VH1.

In the sectional view of FIG. 17, a pad P of the first wiring layer 20 is shown in the partially enlarged plan view of FIG. 17.

Also, the surfaces US of the first insulation layers 30 of both the surfaces-side of the core substrate 10 are smooth without being roughened, and the surface roughness (Ra) of the first insulation layer 30 is 1 nm or greater and less than 30 nm. In FIG. 17, the surface US of the first insulation layer 30 of the upper surface side of the core substrate 10 is "upper surface", and the surface of the first insulation layer 30 of the lower surface side of the core substrate 10 is "lower surface".

Like this, the surface roughness (Ra) of the first wiring layer 20 in the first via hole VH1 is set greater than the surface roughness (Ra) of the first insulation layer 30.

Also, the second wiring layers 22 are respectively thrilled on the first insulation layers 30 of both the surfaces-side of the core substrate 10. The second wiring layer 22 is formed on the second insulation layer 32 from the inside of the first via hole VH1, and is connected to the first wiring layer 20.

The second wiring layer 22 is connected to the first wiring layer 20 through the via conductor VC1 in the first via hole VH1.

As shown in the partially enlarged sectional view of FIG. 17, the second wiring layer 22 is formed by the seed layer 22a and the metal plated layer 22b arranged thereon. The seed layer 22a of the second wiring layer 22 is formed with being embedded in the concavity and convexity of the roughened surface RS of the first wiring layer 20.

Thereby, the second wiring layer 22 is formed with good adhesion on the first wiring layer 20 by the anchor effect of the roughened surface RS of the first wiring layer 20.

Also, the seed layer 22a of the second wiring layer 22 is a sputter film formed by the sputtering method. The seed layer 22a is formed by the titanium (Ti) layer/the copper (Cu) layer in corresponding order from below. Since the Cu layer formed by the sputtering method has poor adhesion to the first insulation layer 30 (resin), the Ti layer is formed as an adhesion layer.

As a metal layer having good adhesion to the first insulation layer 30 (resin), a nickel (Ni) layer, a chromium (Cr) layer or an alloy layer including at least one thereof may also be used, in addition to the titanium (Ti) layer.

For this reason, the second wiring layer 22 is formed with good adhesion on the smooth surface of the first insulation layer 30.

Also, the second insulation layers 32 having the second via holes VH2 reaching the second wiring layers 22 are respectively formed on the first insulation layers 30 of both the surfaces-side of the core substrate 10.

Also, the third wiring layers 24 are respectively formed on the second insulation layers 32 of both the surfaces-side. The third wiring layers 24 of both the surfaces-side are connected to the second wiring layers 22 through the via conductors VC2 in the second via holes VH2, The structure of the via connection in the second via hole VH2 is the same as the structure of the via connection in the first via hole VH1. Also, the surface roughness (Ra) of the second wiring layer 22 in the second via hole VH2 is set greater than each surface roughness (Ra) of the second insulation layer 32 and the second wiring layer 22 in the region other than the second via hole VH2.

Also, the solder resist layers 34 having the openings 34a provided on the third wiring layers 24 are respectively formed on the second insulation layers 32 of both the surfaces-side of the core substrate 10.

The openings 34a of the solder resist layer 34 of the upper surface side of the core substrate 10 are formed therein with the hump electrodes 26 connected to the third wiring layer 24.

The third wiring layer 24 arranged in the openings 34a of the solder resist layer 34 of the lower surface side of the core substrate 10 is configured as pads at which the external connection terminals are to be formed.

As described above, in the wiring substrate 1 of the exemplary embodiment, since the first and second via holes VH1, VH2 are formed by the photolithography, it is possible to arrange the first and second via holes VH1, VH2 at narrow pitches.

Also, since the second and third wiring layers 22, 24 are formed by the semi-additive method in which the seed layer 22a of a thin film formed by the sputtering method is used, it is possible to form the same with the fine pattern.

Therefore, since it is possible to fine the second and third wiring layers 22, 24 with the high density, it is possible to arrange the bump electrodes 26 of a narrow pitch corresponding to the connection terminals of the high performance semiconductor chip.

Meanwhile, in FIG. 17, the multi-layered wiring layers of three layers (first to third wiring layers 20, 22, 24) are respectively formed on both the surfaces of the core substrate 10. However, the number of layers stacked in the multi-layered wiring layer can be arbitrarily set.

Also, the present disclosure can be applied to a variety of wiring substrates. For example, the present disclosure can be applied to a coreless substrate in which the core substrate is omitted.

Also, for a layer, for which a design rule is not strictly applied, of the multi-layered wiring layer, an insulation layer having via holes formed therein by laser processing the non-photosensitive resin layer may be formed, as described above. In this case, after the resin smear in the via holes is removed by the desmear processing, the seed layer is formed by the electroless plating.

Subsequently, an electronic component device in which the wiring substrate 1 shown in FIG. 17 is used is described. As shown in FIG. 18, a semiconductor chip 40 having connection terminals 42 is prepared. Then, the connection terminals 42 of the semiconductor chip 40 are flip chip-connected to the bump electrodes 26 of the wiring substrate 1.

Also, an underfill resin 44 is filled between the wiring substrate 1 and the semiconductor chip 40. The semiconductor chip 40 is an example of the electronic component, and may be an LSI chip such as a CPU, for example.

Also, the openings 34a of the solder resist layer 34 of the lower surface side of the core substrate 10 are formed therein with external connection terminals T connected to the third wiring layer 24. The external connection terminals T are formed by mounting solder balls, for example. By the above, an electronic component device 2 of the exemplary embodiment is obtained.

As described above, since the bump electrodes 26 of the wiring substrate 1 of the exemplary embodiment can be arranged with the narrow pitch, it is possible to cope with the mounting of the high-performance semiconductor chip 40 having a high terminal density.

This disclosure further encompasses various exemplary embodiments, for example, described below.

1. A manufacturing method of a wiring substrate comprising:
forming a photosensitive resin layer on a first wiring layer;
forming an insulation layer having a via hole reaching the first wiring layer by exposing and developing the photosensitive resin layer;
forming a surface of the first wiring layer in the via hole, as a roughened surface; and
forming a second wiring layer, which is connected to the first wiring layer, on the insulation layer from an inside of the via hole.

2. The manufacturing method of a wiring substrate according to claim 1, wherein in the forming of the surface of the first wiring layer in the via hole as the roughened surface,
the inside of the via hole and the surface of the insulation layer are treated with a formic acid solution, so that the surface of the first wiring layer in the via hole is formed as the roughened surface, and
a surface roughness (Ra) of the roughened surface of the first wiring layer is set greater than a surface roughness (Ra) of the insulation layer and a surface roughness (Ra) of the first wiring layer in a region other than the via hole.

3. The manufacturing method of a wiring substrate according to claim 1 or 2, wherein the forming of the second wiring layer comprises:
forming a seed layer in the via hole and on the surface of the insulation layer by a sputtering method,
forming a plated resist layer having an opening on the seed layer,
forming a metal plated layer in the opening of the plated resist layer by an electrolytic plating in which the seed layer is used as a power feeding path for plating,
removing the plated resist layer, and
removing the seed layer by using the metal plated layer, as a mask.

4. The manufacturing method of a wiring substrate according to claim 2, wherein the surface roughness (Ra) of the roughened surface of the first wiring layer is 30 nm to 600 nm, and each surface roughness (Ra) of the insulation layer and the first wiring layer in the region other than the via hole is less than 30 nm.

5. The manufacturing method of a wiring substrate according to one of claims 1 to 4, wherein the first wiring layer is formed of a copper layer, and
wherein in the forming of the surface of the first wiring layer in the via hole as the roughened surface, grain boundary parts of crystal particles of the copper layer are etched in a thickness direction from a surface of the copper layer, so that a concavity and convexity is formed.

What is claimed is:

1. A wiring substrate comprising:
a first wiring layer;
an insulation layer arranged on the first wiring layer and formed of a photosensitive resin;
a via hole formed in the insulation layer and reaching the first wiring layer; and
a second wiring layer formed in the via hole and on the insulation layer and connected to the first wiring layer,
wherein an insulation layer-facing surface of the first wiring layer facing the insulation layer is roughened in a region disposed in the via hole to form a roughened surface of the first wiring layer in the via hole, the roughened surface of the first wiring layer in the via hole having a surface roughness greater than a surface roughness of the insulation layer-facing surface of the first wiring layer in a region other than the via hole.

2. The wiring substrate according to claim 1, wherein a surface roughness of the roughened surface of the first wiring layer in the via hole is greater than a surface roughness of the insulation layer.

3. The wiring substrate according to claim 1, wherein the second wiring layer includes a seed layer and a metal plated layer formed on the seed layer, and the seed layer is a sputter film.

4. The wiring substrate according to claim 2, wherein the surface roughness of the roughened surface of the first wiring layer in the via hole is 30 nm to 600 nm, and the surface roughness of the insulation layer is less than 30 nm.

5. The wiring substrate according to claim 1, wherein the first wiring layer is formed of a copper layer, and wherein the roughened surface of the first wiring layer in the via hole is formed with a concavity and convexity by gaps formed along grain boundary parts of crystal particles of the copper layer in a thickness direction from a surface of the copper layer.

6. The wiring substrate according to claim 1, wherein the surface roughness of the roughened surface of the first wiring layer in the via hole is 30 nm to 600 nm, and the surface roughness of the insulation layer-facing surface of the first wiring layer in the region other than the via hole is less than 30 nm.

7. The wiring substrate according to claim 4, wherein the surface roughness of the insulation layer-facing surface of the first wiring layer in the region other than the via hole is less than 30 nm.

8. The wiring substrate according to claim 1, wherein the first wiring layer includes an electrolytic metal plated layer, and a surface of the electrolytic metal plated layer is formed as a roughened surface.

9. The wiring substrate according to claim 1, further comprising:

an organic film formed on the insulation layer-facing surface of the first wiring layer in the region other than the via hole, wherein the insulation layer-facing surface of the first wiring layer in the region other than the via hole is bonded to the insulation layer via the organic film.

* * * * *